United States Patent
Ahn

(10) Patent No.: US 9,559,632 B2
(45) Date of Patent: Jan. 31, 2017

(54) SOLAR PROPELLED AIRCRAFT STRUCTURE

(71) Applicant: KOREA AEROSPACE RESEARCH INSTITUTE, Daejeon (KR)

(72) Inventor: Hyo Jung Ahn, Daejeon (KR)

(73) Assignee: KOREA AEROSPACE RESEARCH INSTITUTE, Daejeon (KR)

( * ) Notice: Subject to any disclaimer, the term of this patent is extended or adjusted under 35 U.S.C. 154(b) by 7 days.

(21) Appl. No.: 14/435,355

(22) PCT Filed: Nov. 14, 2013

(86) PCT No.: PCT/KR2013/010343
§ 371 (c)(1),
(2) Date: Apr. 13, 2015

(87) PCT Pub. No.: WO2014/178503
PCT Pub. Date: Nov. 6, 2014

(65) Prior Publication Data
US 2015/0256123 A1      Sep. 10, 2015

(30) Foreign Application Priority Data
May 3, 2013    (KR) .................. 10-2013-0049817

(51) Int. Cl.
*H02N 6/00*      (2006.01)
*H01L 31/042*    (2014.01)
(Continued)

(52) U.S. Cl.
CPC ............... *H02S 20/32* (2014.12); *B64C 3/32* (2013.01); *B64D 27/00* (2013.01); *B64D 27/02* (2013.01);
(Continued)

(58) Field of Classification Search
CPC ........ H01L 31/041; H02S 20/32; H02S 10/40; H02S 20/00; H02S 20/30; Y02E 10/50; B64C 2201/042; B64C 3/32; B64D 27/00; B64D 2211/00; B64D 27/02
(Continued)

(56) References Cited

U.S. PATENT DOCUMENTS 8,356,770 B2    1/2013  Parks
2003/0172922 A1*  9/2003  Haber .................. F24J 2/405
                                                          126/600
(Continued)

FOREIGN PATENT DOCUMENTS

ES   WO 2004007044 A1 *  1/2004  ............ A63H 27/02
KR         10-1134061 B1   4/2012
KR         10-1249645 B1   4/2013

OTHER PUBLICATIONS

English machine translation of WO 2004/007044A1.*

*Primary Examiner* — Lindsey Bernier
(74) *Attorney, Agent, or Firm* — Novick, Kim & Lee, PLLC; Jae Youn Kim

(57) ABSTRACT

A solar propelled aircraft which has a wing having solar cell modules mounted therein includes: first solar cell modules which are positioned in a wing or a tail wing of the aircraft and receive solar energy directly from the sun; second solar cell modules which are positioned in a main wing or a tail wing of the aircraft and supplied with directed energy from the earth; and rotating shafts which rotate the first solar cell modules and the second solar cell modules so that the first solar cell modules and the second solar cell modules correspond to each other in both directions. The first solar cell module at the upper surface obtains solar energy from the sun, and the second solar cell module at the lower surface obtains directed energy transferred from the earth.

4 Claims, 4 Drawing Sheets

(51) Int. Cl.
*B64G 1/44* (2006.01)
*H02S 20/30* (2014.01)
*B64D 27/00* (2006.01)
*B64D 27/02* (2006.01)
*B64D 27/24* (2006.01)
*H02S 40/38* (2014.01)
*B64C 3/32* (2006.01)
*H01L 31/041* (2014.01)

(52) U.S. Cl.
CPC ............ *B64D 27/24* (2013.01); *H01L 31/042* (2013.01); *H02S 20/30* (2014.12); *H02S 40/38* (2014.12); *B64C 2201/042* (2013.01); *B64D 2211/00* (2013.01); *H01L 31/041* (2014.12); *Y02E 10/50* (2013.01)

(58) Field of Classification Search
USPC ............... 136/244, 246, 251, 292; 244/172.7
See application file for complete search history.

(56) References Cited

U.S. PATENT DOCUMENTS

| | | |
|---|---|---|
| 2009/0292407 A1 | 11/2009 | Minelli et al. |
| 2010/0102202 A1 | 4/2010 | Sherman |

\* cited by examiner

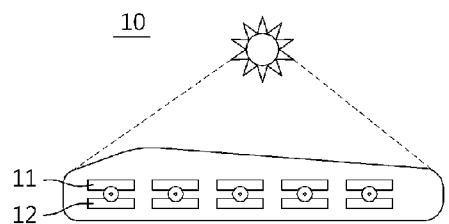
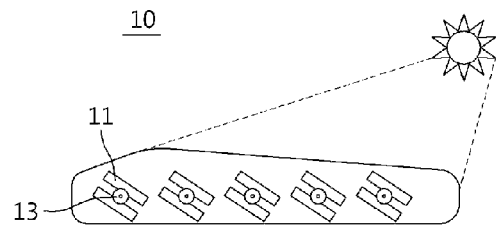
FIG. 2A
FIG. 2B
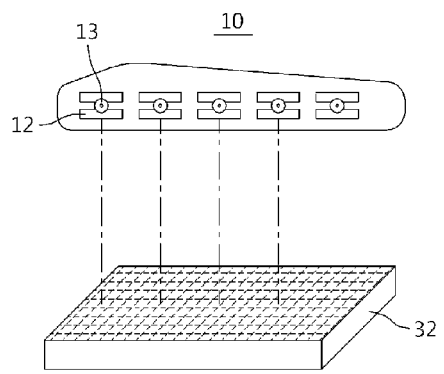
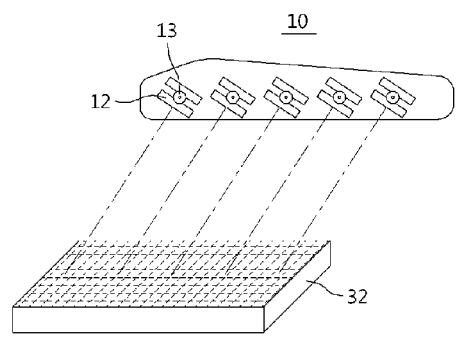
FIG. 2C
FIG. 2D

SOLAR PROPELLED AIRCRAFT STRUCTURE

TECHNICAL FIELD

The present invention relates to a wing structure of a solar propelled aircraft and controlling solar cells included in the wing structure, and more particularly, to solar panels control method which obtains solar energy and directed energy using a configuration in which a wing surface is made of a material that is transparent or capable of allowing the corresponding energy to penetrate, and a support having both surfaces to which the solar cells are attached is present in the aircraft wing.

BACKGROUND ART

U.S. Patent Publication No. 2009-0292407 discloses a method of obtaining energy by attaching solar panels to a surface of an aircraft tail wing. In this case, the tail wing of the aircraft fuselage is rotated. The solar cell modules are attached in a V shape to the tail wing, and receive solar energy while the tail wing is rotated in a flying direction. In this case, because the modules are attached to the surface of the tail wing, the modules are significantly affected by the external environment. The solar cell modules are vulnerable to contamination or external collisions and are likely to affect aerodynamic property when the solar cell modules are deformed. In addition, because the solar cells are attached to the tail wing, the aircraft needs to fly while selecting a flying path to collect energy.

Korean Patent Application No. 2011-0128455 discloses a method of obtaining energy by attaching solar panels to a surface of an aircraft tail wing. In this case, because the cell plates are fixed to a wing or a tail, there is a problem in that it is difficult to obtain energy due to seasons or weather, and particularly, because intensity of solar radiation and a volume of sunshine duration are reduced in the winter season or in cloudy weather, there is a problem in that it is difficult to receive sufficient energy. It is urgently needed to research a technology in which cell plates are not affected by the external environment and are rotated in accordance with a position at which energy is transferred so as to effectively obtain a large amount of energy.

DISCLOSURE

Technical Problem

An object of the present invention is to solve problems in that solar cell modules are attached to surfaces of aircraft wings such that the solar cell modules are affected by the environment while flying, and an amount of obtained energy varies in accordance with a flying path and a change in posture of an aircraft or in accordance with a relative change in position of the sun or directed energy. Therefore, an object of the present invention is to efficiently obtain a large amount of energy by mounting solar cell modules in a wing, and by rotating the solar cell modules in the space by a controller so that the solar cell modules are directed toward the sun and directed energy.

Technical Solution

A solar propelled aircraft which has solar cell modules mounted therein includes: first solar cell modules which are positioned in a wing or a tail wing of the aircraft and receive solar energy directly from the sun; second solar cell modules which are positioned in a wing or a tail wing of the aircraft and supplied with directed energy from the earth; and rotating shafts which rotate the first solar cell modules and the second solar cell modules so that the first solar cell modules and the second solar cell modules correspond to each other in both directions. A surface of the wing or the tail wing may be made of a material that is transparent or capable of allowing the corresponding energy to penetrate, the first solar cell module may be installed on an upper surface of the rotating shaft, a controller which rotates the first solar cell module in accordance with a position of the sun may be further included, the second solar cell module may be installed on a lower surface of the rotating shaft, and the controller may rotate the second solar cell module in accordance with a position at which directed energy is transferred. The first solar cell module and the second solar cell module may be independently rotated in accordance with positions of energy sources. The solar propelled aircraft may include a GPS which always confirms its own position, a sensor which confirms a position of the sun, and a communication component which finds out a position of a base station which transfers directed energy.

Meanwhile, the present invention may include any one of the first solar cell module and the second solar cell module (including the rotating shaft, the controller and the like associated with each solar cell module).

Advantageous Effects

According to the exemplary embodiments of the present invention, the solar cells on both surfaces in the aircraft are rotated by the rotating shafts, the first solar cell module at the upper surface obtains solar energy from the sun, and the second solar cell module at the lower surface obtains directed energy transferred from the earth. The solar cell modules at both surfaces obtain a larger amount of energy while being rotated, and the solar cell modules are positioned in the wings so as to be less affected by the environment while flying, thereby improving durability of the solar cell modules.

DESCRIPTION OF DRAWINGS

FIGS. 2A-2D are side views illustrating the aircraft wing in which the solar cell modules are mounted.

DESCRIPTION OF MAIN REFERENCE NUMERALS OF DRAWINGS

Figure 1:
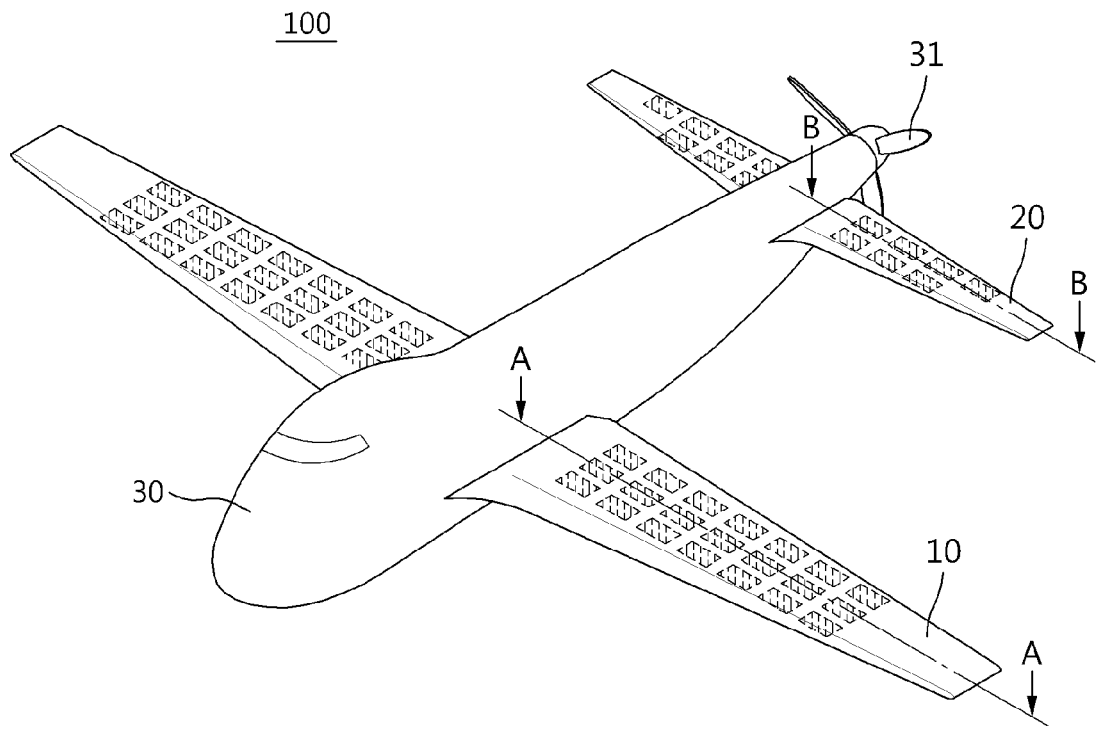
FIG. 1 is a configuration view of a solar propelled aircraft in which solar cell modules are mounted in aircraft wings or a tail portion.

10: Main wing
11: First solar cell module
12: Second solar cell module
13: Rotating shaft
20: Tail wing
30: Body
31: Propeller
32: Directed energy
40: GPS, check position
50: Sensor, check position of sun 60: Communication
70: Controller
80: Control supply system
100: Aircraft

BEST MODE

FIG. 1 is a configuration view of a solar propelled aircraft 100 in which solar cell modules are mounted in aircraft wings or a tail portion, FIGS. 2A-2D are side views illustrating an aircraft wing 10 in which the solar cell modules are mounted, and FIGS. 3A-3D are side views illustrating a tail portion 20 of the aircraft in which the solar cell modules are mounted. As illustrated in the drawings, the solar propelled aircraft 100 includes a body 30, a main wing 10, the tail wing 20, and a propeller 31. It is not necessary to store fuel in the solar propelled aircraft 100 because the solar propelled aircraft 100 does not have a turbine engine, and as a result, there is no reason why a fuel tank should be provided in an internal space in the wing. Therefore, solar cell modules are mounted in the internal space where the fuel tank would have been provided, thereby utilizing a space.

The solar cell modules are attached to both surfaces, an upper surface and a lower surface of a panel, so as to correspond to both directions, and the panel having the upper surface and the lower surface on which the solar cell modules are attached is connected with a rotating shaft 13. A first solar cell module 11 attached to the upper surface obtains solar energy, and a second solar cell module 12 attached to the lower surface obtains directed energy 32 transferred from the earth. While the rotating shaft 13 is rotated by a controller along the path of the sun, the solar cell module is directed toward the sun and obtains energy, and the second solar cell module attached to the lower surface receives the directed energy 32 from a directed energy supply apparatus on earth. Directions of the first solar cell module 11 and the second solar cell module 12 disposed in the aircraft wing 10 or the tail wing 20 are controlled so that the first solar cell module 11 and the second solar cell module 12 are directed toward energy sources.

As illustrated in FIGS. 2A and 2B, the first solar cell modules 11 in the main wing 10 obtain energy while rotating along the path of the sun. In FIGS. 2C and 2D, the second solar cell modules 13 in the main wing 10 obtain the directed energy 32 in a direction in which the directed energy supply apparatus transfers the directed energy 32.

Figure 3A:
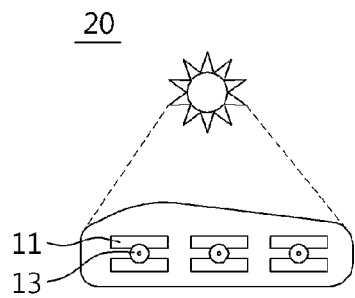
FIGS. 3A-3D are side views illustrating the tail portion of the aircraft in which the solar cell modules are mounted.
Figure 3B:
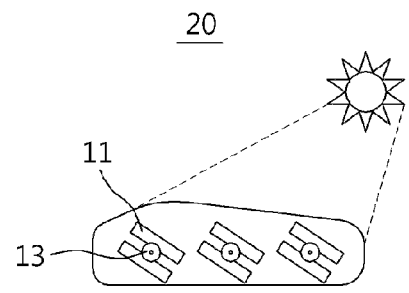
Figure 3C:
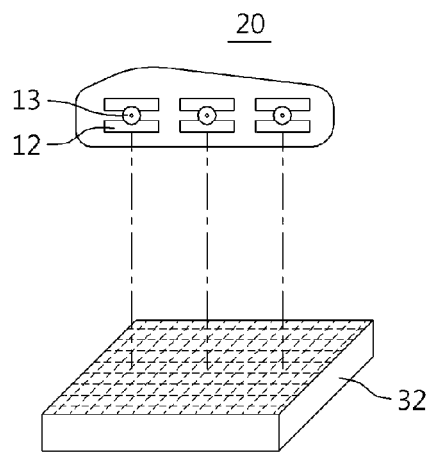
Figure 3D:
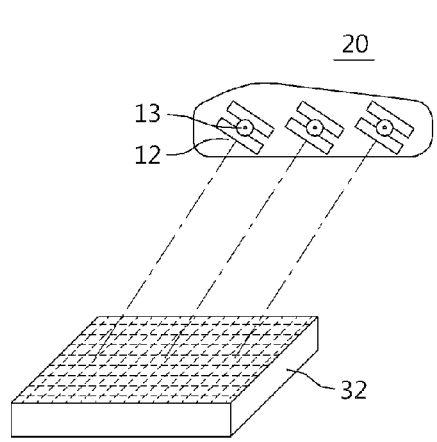
Figure 4:
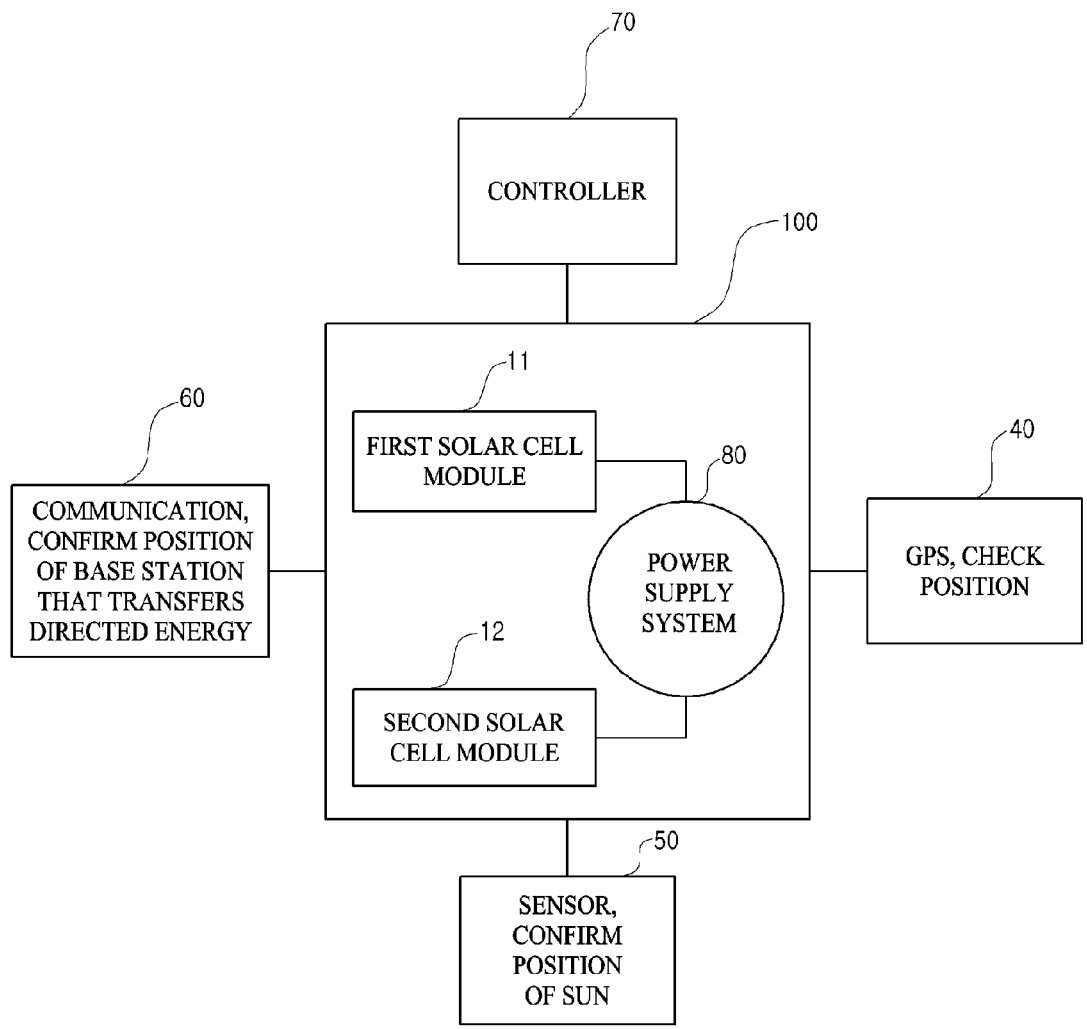
FIG. 4 is a configuration view of a solar cell module control method.

In FIGS. 3A and 3B, the first solar cell modules 11 in the tail wing 20 obtain energy while rotating along the path of the sun. In FIGS. 3C and 2D, the second solar cell modules 12 in the tail wing 20 obtain the directed energy 32 in a direction in which the directed energy supply apparatus transfers the directed energy 32.

Hereinafter, an operating method will be described.

A power supply system 80 is configured so that the directions of the first solar cell module 11 and the second solar cell module 12 disposed in the aircraft wing 10 or the tail wing 20 is controlled so that the first solar cell module 11 and the second solar cell module 12 are directed toward the energy sources. The aircraft 100 always checks its own position using a GPS 40, and confirms a position of the sun using a sensor 50. After confirming the position of the sun, the aircraft 100 allows the first solar cell modules 11 to be directed toward the sun and obtain energy.

In addition, a position of a base station, which transfers directed energy, is confirmed, communication 60 is always carried out with the earth, and the second solar cell modules 12 are supplied with the directed energy 32 from the directed energy supply apparatus. A controller 70 mounted in the solar cell unmanned aircraft 100 calculates its own position relative to the energy sources, and latitude, calculates an angle at which the solar cell modules may obtain maximum energy, and rotates the solar cell modules in accordance with the position.

Because the first solar cell modules 11 and the second solar cell modules 12 are present in the wing 10, the first solar cell modules 11 and the second solar cell modules 12 are less affected by the environment while flying such that durability thereof is greatly improved, and dust and the like are not attached to the first solar cell modules 11 and the second solar cell modules 12 such that the products may be used for a longer time in a clean state. The first solar cell modules 11 and the second solar cell modules 12 are rotated in the wings by the controller 70 instead of being installed on the surfaces of the aircraft, thereby obtaining a larger amount of energy. In addition, the surface of the wing 10 or the tail wing 20 is made of a material that is transparent or capable of allowing energy to penetrate, such that a larger amount of energy may be obtained, and the first solar cell modules 11 and the second solar cell modules 12 are moved by confirming the relative position such that energy may be efficiently obtained.

Meanwhile, the present invention may include any one of the first solar cell module and the second solar cell module (including the rotating shaft, the controller and the like associated with each solar cell module).

As the foregoing, the present invention has been described with reference to particular configurations such as specific constituent elements, the limited exemplary embodiments and the drawings, but the configurations, the exemplary embodiments, and the drawings are provided for better understanding of the present invention. In addition, the present invention is not limited to the exemplary embodiments, but the present invention may be variously corrected and modified from the exemplary embodiments by those skilled in the technical field to which the present invention pertains. Thus, it should be interpreted that the spirit of the present invention is not defined as being limited to the exemplary embodiments, the appended claims, all of the modified forms induced from the scope of the claims, and the equivalent concept thereto are included in the scope of the present invention.

The invention claimed is:

1. A solar propelled aircraft structure for an aircraft, the solar propelled aircraft structure comprising:
   a first panel and a second panel each having a first planar surface and a second planar surface, wherein the first planar surface of each panel is parallel and opposite to the second planar surface of each panel;
   a first solar cell module which is positioned in a main wing or a tail wing of the aircraft, disposed on the first planar surface of the first panel, and receives solar energy directly from the sun;
   a second solar cell module which is positioned in the main wing or the tail wing of the aircraft, disposed on the second planar surface of the second panel, and supplied with directed energy from a directed energy supply apparatus; and
   a rotating shaft which is located between and connected to the first and second panels,
   wherein the rotating shaft is rotated by a controller so that the first and second panels are rotated by the rotating shaft, wherein the second planar surface of the first panel is directly connected to the rotating shaft, wherein the first planar surface of the second panel is directly connected to the rotating shaft, and wherein the second planar surface of the first panel and the first planar surface of the second panel are parallel to and face each other.

2. The solar propelled aircraft structure of claim 1, wherein a surface of the main wing or the tail wing of the aircraft is made of a material that is transparent or capable of allowing the solar or directed energy to penetrate.

3. An energy supply system for an aircraft, the system comprising:

a solar propelled aircraft structure and a directed energy supply apparatus located on a ground lower than a flying altitude of the aircraft, wherein the solar propelled aircraft structure comprises:

a first panel and a second panel each having a first planar surface and a second planar surface wherein the first planar surface of each panel is parallel and opposite to the second planar surface of each panel;

a first solar cell module which is positioned in a main wing or a tail wing of the aircraft, disposed on the first planar surface of the first panel, and receives solar energy directly from the sun;

a second solar cell module which is positioned in the main wing or the tail wing of the aircraft, is disposed on the second planar surface of the second panel, and is supplied with directed energy from the directed energy supply apparatus; and a rotating shaft which is located between and connected to the first and second panels, wherein the rotating shaft is rotated by a controller so that the first and second panels are rotated by the rotating shaft, wherein the second planar surface of the first panel is directly connected to the rotating shaft, wherein the first planar surface of the second panel is directly connected to the rotating shaft, and wherein the second planar surface of the first panel and the first planar surface of the second panel are parallel to and face each other.

4. The system of claim 3, wherein a surface of the main wing or the tail wing of the aircraft is made of a material that is transparent or capable of allowing the directed energy to penetrate.

* * * * *